United States Patent
Kim et al.

(10) Patent No.: US 10,121,850 B2
(45) Date of Patent: Nov. 6, 2018

(54) POWER SEMICONDUCTOR DEVICE AND METHOD OF FABRICATING THE SAME

(71) Applicant: Hyundai Autron Co., Ltd., Seongnam-si (KR)

(72) Inventors: Young Joon Kim, Suwon-si (KR); Hyuk Woo, Incheon (KR); Tae Yeop Kim, Seoul (KR); Han Sin Cho, Hwaseong-si (KR); Tae Young Park, Gunpo-si (KR); Ju Hwan Lee, Suwon-si (KR)

(73) Assignee: HYUNDAI AUTRON CO., LTD, Seongnam-Si (KR)

( * ) Notice: Subject to any disclaimer, the term of this patent is extended or adjusted under 35 U.S.C. 154(b) by 11 days.

(21) Appl. No.: 15/612,683

(22) Filed: Jun. 2, 2017

(65) Prior Publication Data

US 2017/0352725 A1    Dec. 7, 2017

(30) Foreign Application Priority Data

Jun. 3, 2016  (KR) .................. 10-2016-0069550

(51) Int. Cl.
| | | |
|---|---|---|
| H01L 29/06 | (2006.01) | |
| H01L 21/761 | (2006.01) | |
| H01L 29/10 | (2006.01) | |
| H01L 29/739 | (2006.01) | |

(Continued)

(52) U.S. Cl.
CPC ........ *H01L 29/0623* (2013.01); *H01L 21/761* (2013.01); *H01L 29/0619* (2013.01); *H01L 29/0638* (2013.01); *H01L 29/1095* (2013.01); *H01L 29/66348* (2013.01); *H01L 29/7397* (2013.01); *H01L 29/402* (2013.01)

(58) Field of Classification Search
CPC combination set(s) only.
See application file for complete search history.

(56) References Cited

U.S. PATENT DOCUMENTS

2013/0175574 A1*  7/2013  Matsuura .......... H01L 29/66348
                                                              257/139
2017/0125560 A1*  5/2017  Voss .................... H01L 29/0615

FOREIGN PATENT DOCUMENTS

| JP | 2004-349634 A | 12/2004 |
| JP | 2006-005248 A | 1/2006 |
| KR | 10-2014-0057630 A | 5/2014 |

* cited by examiner

*Primary Examiner* — Ratisha Mehta
(74) *Attorney, Agent, or Firm* — Morgan, Lewis & Bockius LLP

(57) ABSTRACT

Provided is a power semiconductor device comprising a gate electrode in a trench of a substrate; a body region having a first conductivity type on one side of the gate electrode; a source region having a second conductivity type adjacent to the gate electrode; a floating region having a first conductivity type on the other side of the gate electrode; an edge doped region having a first conductivity type spaced apart from the floating region and electrically connected to the source region; an edge junction isolation region having a second conductivity type between the floating region and the edge doped region; and a drift region having a second conductivity type below the floating, edge doped, and edge junction isolation regions, wherein the doping concentration of a second conductivity type in the edge junction isolation region is higher than the doping concentration of a second conductivity type in the drift region.

9 Claims, 4 Drawing Sheets

(51) Int. Cl.
*H01L 29/66* (2006.01)
*H01L 29/40* (2006.01)

POWER SEMICONDUCTOR DEVICE AND METHOD OF FABRICATING THE SAME

CROSS-REFERENCE TO RELATED APPLICATIONS

This application claims priority to and the benefit of Korean Patent Application No. 10-2016-0069550 filed in the Korean Intellectual Property Office on Jun. 3, 2016, the entire contents of which are incorporated herein by reference.

BACKGROUND

Field

The present invention relates to a power semiconductor device and a manufacturing method thereof, and more particularly, to an insulated gate bipolar transistor (IGBT) device and a manufacturing method thereof.

Related Technology

Insulated gate bipolar transistor (IGBT) is developed through a functional integration of metal-oxide-semiconductor (MOS) technology and bipolar physics. It is characterized by its low saturation voltage and fast-switching capabilities. Its application is expanded to applications that cannot be realized with thyristors, bipolar transistors, MOSFET, etc. It also is a next-generation power semiconductor device that is essentially used in a high-efficiency, high-speed power system widely used in a voltage range of 300 V or higher. Since the development of power MOSFETs in the 1970s, MOSFETs have been used as switching devices in the fields where fast-switching capabilities are required, while bipolar transistors, thyristors, GTOs, etc. have been used in the fields where a large amount of current conduction is required at medium to high voltages. The IGBT, which was developed in the early 1980s, has a better current capability than bipolar transistors in terms of output characteristics and has gate driving characteristics like MOSFETs in terms of input characteristics, and therefore it is capable of switching at a high speed of about 100 KHz. Accordingly, the IGBT is being used in a wide range of applications, from industrial to home electronics since it is used not only for devices to replace MOSFETs, bipolar transistors, and thyristors but also for creating new application systems.

A related prior art is Korean Laid-Open Publication No. 20140057630 (published on May 13, 2014, entitled "IGBT and manufacturing method thereof").

SUMMARY

An object of the present invention is to provide a semiconductor device and a method of manufacturing the semiconductor device, capable of preventing the dynamic breakdown voltage from being lowered by the Hall current during the IGBT switching and securing robustness and space efficiency. However, these problems are illustrative, and thus the scope of the present invention is not limited thereto.

A power semiconductor device according to an aspect of the present invention for solving the above problems is provided. The power semiconductor device includes: a gate electrode disposed in a trench of a substrate; a body region having a first conductivity type disposed on one side of the gate electrode in the substrate; a source region having a second conductivity type disposed adjacent to the gate electrode in the body region having a first conductivity type; a floating region having a first conductivity type disposed on the other side of the gate electrode in the substrate; an edge doped region having a first conductivity type spaced apart from the floating region having a first conductivity type and electrically connected to the source region in the substrate; an edge junction isolation region having a second conductivity type interposed between the floating region having a first conductivity type and the edge doped region having a first conductivity type in the substrate; and a drift region having a second conductivity type disposed below the floating region having a first conductivity type, the edge doped region having a first conductivity type, and the edge junction isolation region having a second conductivity type, wherein the doping concentration of a second conductivity type in the edge junction isolation region is higher than the doping concentration of a second conductivity type in the drift region In the power semiconductor device, the edge doped region having a first conductivity type may be disposed in an edge termination region of the device.

The power semiconductor device may further include a wiring pattern disposed on the substrate to electrically connect the source region and the edge doped region having a first conductivity type.

In the power semiconductor device, the floating region having a first conductivity type may surround the bottom surface and at least the other side of the gate electrode, the maximum doping depth of the floating region having a first conductivity type may be larger than the depth of the trench, and the maximum doping depth of the edge doped region having a first conductivity type may be larger than the depth of the trench.

In the power semiconductor device, in a vertical distribution of the electric field from an upper surface of the substrate through a region between the floating region having a first conductivity type and the edge doped region having a first conductivity type to a lower surface of the substrate, a depth at which a maximum electric field is located may be larger than the depth of the trench.

In the power semiconductor device, the substrate may include a wafer and an epitaxial layer grown on the wafer, and a region below the floating region having a first conductivity type and a region below the edge doped region having a first conductivity type may include a boundary surface between the wafer and the epitaxial layer.

In the power semiconductor device, the second conductivity type and the first conductivity type may have opposite conductivity types and may be each one of n-type and p-type.

According to another aspect of the present invention, there is provided a method for fabricating a power semiconductor device. The method includes: implanting impurities having a first conductivity type into a first region and a second region on a wafer; implanting impurities having a second conductivity type, which have a higher doping concentration than that of the impurities having a second conductivity type in the wafer, into a third region disposed between the first region and the second region; forming a substrate by forming an epitaxial layer on the wafer, the substrate comprising the wafer and the epitaxial layer; forming a floating region having a first conductivity type in the substrate corresponding to the first region, an edge doped region having a first conductivity type in the substrate corresponding to the second region, and an edge junction isolation region having a second conductivity type in the substrate corresponding to the third region, by diffusing the impurities; forming a source region having a second conductivity type by implanting impurities into the epitaxial layer and diffusing the impurities; and forming a wiring pattern for electrically connecting the source region and the edge doped region.

In the method of fabricating the power semiconductor device, a region below the floating region having a first conductivity type and a region below the edge doped region having a first conductivity type may include a boundary surface between the wafer and the epitaxial layer.

Advantageous Effects

According to an embodiment of the present invention as described above, a power semiconductor device capable of securing robustness and space efficiency can be realized by using a junction utilizing charge sharing effects. Of course, the scope of the present invention is not limited by these effects.

EXPLANATION OF REFERENCE NUMERALS

Figure 1:
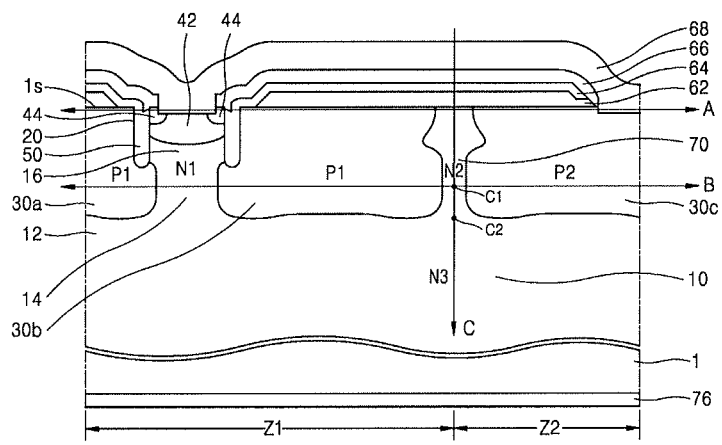
FIG. 1 is a cross-sectional view illustrating a structure of a power semiconductor device according to an embodiment of the present invention.

1: substrate
10: drift region
20: trench
30a, 30b: floating region
30c: edge doped region
42: body region
44: source region
50: gate electrode
70: edge junction isolation region

DETAILED DESCRIPTION

Hereinafter, embodiments of the present invention will be described in detail with reference to the accompanying drawings. However, it should be understood that the present invention is not limited to the embodiments described below, but may be embodied in various other forms. The following embodiments are intended to give a more complete description of the present disclosure, and are provided in order to fully convey the scope of the disclosure to those skilled in the art. Also, at least some of the components may be exaggerated or reduced in size for convenience of explanation. Like reference numerals refer to like elements throughout the drawings.

In this specification, a first conductivity type and a second conductivity type may have opposite conductivity types, and may be one of n-type and p-type, respectively. For example, the first conductivity type may be of p-type and the second conductivity type may be of n-type, and theses conductivity types are illustratively represented in the accompanying drawings. However, the technical idea of the present invention is not limited thereto. For example, the first conductivity type may be of n-type and the second conductivity type may be of p-type.

Figure 2:
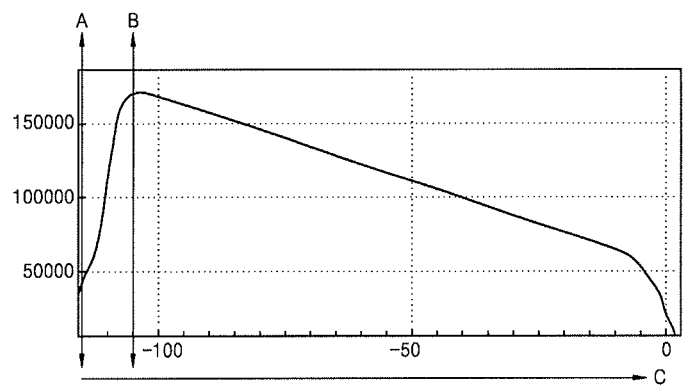
FIG. 2 is a graph illustrating the magnitude of an electric field in the C-direction in the power semiconductor device according to an embodiment of the present invention shown in FIG. 1.

FIG. 1 is a cross-sectional view illustrating a structure of a power semiconductor device according to an embodiment of the present invention, and FIG. 2 is a graph illustrating the magnitude of an electric field in the C-direction in the power semiconductor device according to an embodiment of the present invention shown in FIG. 1.

Referring to FIG. 1, a power semiconductor device according to an embodiment of the present invention includes a gate electrode 50 disposed in a trench 20 of a substrate 1. Here, the substrate 1 can be understood to include a wafer and an epitaxial layer that is epitaxially grown on the wafer. Furthermore, the power semiconductor device includes a body region 42 having a first conductivity type disposed on one side of the gate electrode 50 in the substrate 1 and a source region 44 having a second conductivity type disposed adjacent to the gate electrode 50 in the body region 42 having a first conductivity type.

The power semiconductor device according to an embodiment of the present invention includes a floating region 30b having a first conductivity type disposed on the other side of the gate electrode 50 in the substrate 1, an edge doped region 30c having a first conductivity type that is spaced apart from the floating region 30b having a first conductivity type in the substrate 1 and electrically connected to the source region 44, and an edge junction isolation region 70 having a second conductivity type that is interposed between the floating region 30b having a first conductivity type and the edge doped region 30c having a first conductivity type in the substrate 1.

Furthermore, the power semiconductor device according to the embodiment of the present invention includes a drift region 10 having a second conductivity type. The drift region 10 is disposed below the floating region 30b having a first conductivity type, the edge doped region 30c having a first conductivity type and the edge junction isolation region 70 having a second conductivity type. The doping concentration N2 of a second conductivity type in the edge junction isolation region 70 is greater than the doping concentration N3 of a second conductivity type in the drift region 10.

The edge doped region 30c having a first conductivity type is disposed in an edge termination region Z2 of the power semiconductor device. The edge doped region 30c having a first conductivity type is electrically connected to the source region 44 via a wiring pattern 68 disposed on the substrate 1. Thus, the edge doped region 30c is maintained as a potential source. Although not shown in the drawings, an edge structure such as a field plate or a channel stopper is provided between the edge doped region 30c and the edge of the substrate 1.

A conductive pattern 64 electrically connected to the gate electrode 50 and a conductive pattern 68 electrically connected to the source region 44 and the body region 42 are disposed on the substrate 1. The conductive patterns 64 and 68 function as electrodes or contacts, and can be electrically insulated with insulating patterns 62 and 66 interposed therebetween. Meanwhile, a collector electrode 76 is disposed under the substrate 1 and, although not shown in the drawings, a buffer layer having a second conductivity type and/or a collector layer having a first conductivity type may be formed before the collector electrode 76 is formed.

According to the arrangement in the C-direction shown in FIG. 1, the floating region 30*b* and the edge doping region 30*c*, which are p-type junctions, are isolated by an n-type junction. The doping concentration N2 of a second conductivity type in the edge junction isolation region 70 is relatively higher than the doping concentration N3 of a second conductivity type in the drift region 10. In this structure, a maximum electric field can be generated below the central depth of the vertical thickness of the floating region 30*b* and the edge doped region 30*c* having a first conductivity type, for example in the B section C1. The charge balance may be adjusted such that the maximum electric field is directed downward to the bottom C2 of the floating region 30*b* and the edge doped region 30*c*.

In a conventional power semiconductor device, a maximum electric field is generated in the A section. However, since a maximum electric field is generated in the B section in the power semiconductor device having this structure, it is possible to reduce or prevent the phenomenon in which the breakdown voltage is lowered by changes in the dynamic electric field due to hole injection in the switching state. That is, in the conventional isolation structure the dynamic breakdown voltage due to Hall currents is lowered during the IGBT switching, while it is advantageous that the isolation structure of the present invention uses junctions utilizing charge sharing effects to secure robustness and space efficiency.

If the relationship between a static electric field and the amount of electric charge in an n-type depletion when the voltage is applied is simplified to one dimension along the C-direction, it will be $dE/dx=(1/\varepsilon)*n$, which may be regarded as a function of only an n-type doping. When the carrier is injected during IGBT operation, however, it will change to $dE/dx=(1/\varepsilon)*(n+h-e)$ due to the influence of the amount of the injected charges, and h (hole concentration) causes the rate of change in electric field to increase since there is no electron injection by the MOS in the C section. In a conventional structure, an increase in the rate of change in electric field due to a change in hole concentration reduces the area of electric field at the same maximum electric field, thereby abruptly lowering the breakdown voltage. In this structure, however, there is provided a section between A and B, in which the rate of change in electric field is negative such that an increase in the gradient of electric field increases the area of the electric field, thereby alleviating the lowering of the breakdown voltage. According to the technical idea of the present invention described above, it is possible to realize a power semiconductor device capable of preventing the lowering of dynamic breakdown voltage in the isolation section due to the current flow during a high-voltage switching, thereby enhancing the robustness of the IGBT.

Figure 3:
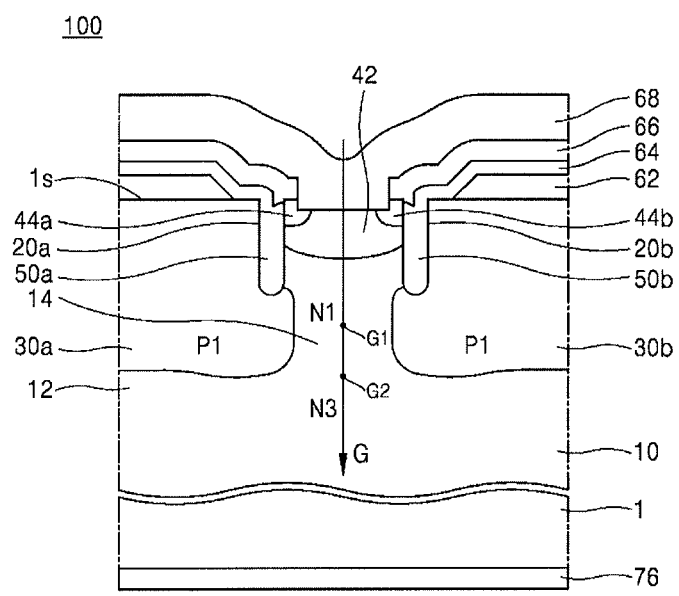
FIG. 3 is a cross-sectional view illustrating a partial structure of a power semiconductor device according to an embodiment of the present invention.

FIG. 3 is a cross-sectional view illustrating a partial structure of a power semiconductor device according to an embodiment of the present invention, which corresponds to the arrangement disposed on the left side of the edge junction isolation region 70 shown in FIG. 1.

Referring to FIG. 3, the power semiconductor device 100 includes a pair of gate electrodes 50*a* and 50*b* disposed in a first trench 20*a* and a second trench 20*b*, respectively, which are spaced apart from each other in the substrate 1. Here, the substrate 1 can be understood to include a wafer and an epitaxial layer that is epitaxially grown on the wafer. The power semiconductor device 100 further includes a body region 42 having a first conductivity type disposed between the first trench 20*a* and the second trench 20*b* in the substrate 1, a pair of source regions 44*a* and 44*b* having a second conductivity type that are spaced apart from each other and disposed adjacent to the first trench 20*a* and the second trench 20*b* in the substrate 42, respectively, a floating region 30*a* having a first conductivity type that surrounds the bottom surface and at least one side surface of the first trench 20*a* in the substrate 1, and a floating region 30*b* having a first conductivity type that surrounds the bottom surface and at least one side surface of the second trench 20*b*. The floating regions 30*a* and 30*b* having a first conductivity type are spaced apart from each other in the substrate 1. The depth to the bottom surfaces of the floating regions 30*a* and 30*b* with respect to the top surface 1*s* of the substrate 1 is larger than the depth to the bottom surfaces of the first trench 20*a* and the second trench 20*b*. That is, the maximum doping depth of the floating regions 30*a* and 30*b* having a first conductivity type may be larger than the depth of the first trench 20*a* and the second trench 20*b*.

The power semiconductor device 100 according to an embodiment of the present invention includes a drift region 10 having a second conductivity type that extends from below a pair of floating regions 30*a* and 30*b* having a first conductivity type in the substrate 1 through a region 14 between the pair of floating regions 30*a* and 30*b* having a first conductivity type to the body region 42 of a first conductivity type. Particularly, in the drift region 10, the doping concentration N1 of a second conductivity type between the pair of floating regions 30*a* and 30*b* having a first conductivity type is higher than the doping concentration N3 of a second conductivity type below the pair of floating regions 30*a* and 30*b* having a first conductivity type.

Meanwhile, the maximum doping depth of the body region 42 having a first conductivity type is smaller than the depths of the first trench 20*a* and the second trench 20*b*, and the maximum doping depth of the floating regions 30*a* and 30*b* having a first conductivity type may be larger than the depths of the first trench 20*a* and the second trench 20*b*. Here, in the drift region 10, the doping concentration of a second conductivity type between the pair of the floating regions 30*a* and 30*b* having a first conductivity type and the doping concentration of a second conductivity type between the first trench 20*a* and the second trench 20*b* may be larger than the doping concentration of a second conductivity type below the pair of floating regions 30*a* and 30*b* having a first conductivity type.

If the floating regions 30*a* and 30*b* are not provided to the bottom of the trenches 20*a* and 20*b* as compared with the power semiconductor device 100 according to the embodiment of the present invention described above, it is problematic that the electric field increases at the bottom of the trenches 20*a* and 20*b*. Furthermore, if the floating regions 30*a* and 30*b* are provided only to the bottom of the trenches 20*a* and 20*b*, it is problematic that, when the distance between the trenches 20*a* and 20*b* in a G-direction MOSFET supplying the base current of the IGBT is reduced, a base current path is limited by the diffusion of impurities of a first conductivity type and therefore the cell pitch cannot be reduced below a certain distance.

The doping concentration N1 of a second conductivity type between the pair of floating regions 30*a* and 30*b* having a first conductivity type is greater than the doping concentration N3 of a second conductivity type in the lower region 12 of the floating regions 30*a* and 30*b* having a first conductivity type. Therefore, even if the distance between the trenches 20*a* and 20*b* becomes narrow, a base current supply path is formed and an abundant base current is supplied, the balance between N1 and P1 is formed such that the maximum electric field is generated in the lower part of the floating regions 30a and 30b, thereby enhancing robustness.

That is, the formation of the N1 region may help reduce or prevent the phenomenon that the impurities having a first conductivity type in the floating regions 30a and 30b are diffused to limit the base current path when the distance F between the trenches in the G-direction MOSFET supplying the base current of the IGBT is reduced. In the power semiconductor device 100 according to an embodiment of the present invention, a high cell density is obtained with a distance F, which is narrower if the same transconductance is assumed, such that the current density in the G section is reduced for the same total currents and local temperature rise is prevented, thereby improving short circuit characteristics.

The IGBT resistance and the short circuit characteristics are improved by this principle and the total amount of electric charges of the impurity concentration N1 of a second conductivity type of the region 14 and the impurity concentration P1 of a first conductivity type of the floating regions 30a and 30b are controlled such that the maximum electric field is generated in the lower portions of the floating regions 30a and 30b, thereby improving robustness. Here, the lower portions where the maximum electric field G1 is generated are lower than the bottom surfaces of the trenches 20a and 20b. Meanwhile, in modified embodiments, the region where the maximum electric field G2 is generated may have the same height as the bottom surfaces of the floating regions 30a and 30b.

If the relationship between a static electric field and the amount of electric charge in an n-type depletion when the voltage is applied is simplified to one dimension along the C-direction, it will be $dE/dx=(1/\varepsilon)*n$, which may be regarded as a function of only an n-type doping. When the carrier is injected during IGBT operation, however, it will change to $dE/dx=(1/\varepsilon)*(n+h-e)$ due to the influence of the amount of the injected charges, and, in a conventional structure, when the hole density is in an excess state in the G section during turn-off, an increase in the rate of change in electric field due to a change in hole concentration reduces the area of electric field at the same maximum electric field, thereby abruptly lowering the breakdown voltage. In this structure, however, there is provided a section between the bottom surfaces of trenches 20a and 20b and the bottom surface of the body region 42, in which the rate of change in electric field is negative such that an increase in the gradient of electric field increases the area of the electric field, thereby alleviating the lowering of the breakdown voltage.

FIGS. 4A to 4F are cross-sectional views illustrating a method of manufacturing a power semiconductor device according to an embodiment of the present invention.

Figure 4A:
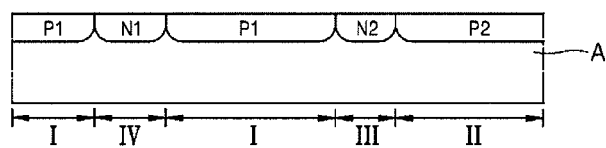
FIG. 4A, FIG. 4B, FIG. 4C, FIG. 4D, FIG. 4E and FIG. 4F are cross-sectional views illustrating a method of manufacturing a power semiconductor device according to an embodiment of the present invention.

Referring to FIG. 4A, impurities having a first conductivity type are implanted into a first region I and a second region II on a wafer A, and impurities having a second conductivity type, which have a higher doping concentration than that of the impurities having a second conductivity type in the wafer A, are implanted into a third region III and a fourth region IV disposed between the first region I and the second region II. This impurity implantation process may be carried out sequentially or concurrently by selectively distinguishing at least some regions selected from the first region I to the fourth region IV and dividing the selected regions into a number of regions. The P1 region, the N1 region, the N2 region and the P2 region shown in FIG. 4A respectively correspond to part of the floating regions 30a and 30b, the drift region 14 between the floating regions 30a and 30b, the edge junction isolation region 70 and the edge doped region 30c shown in FIG. 1.

Figure 4B:
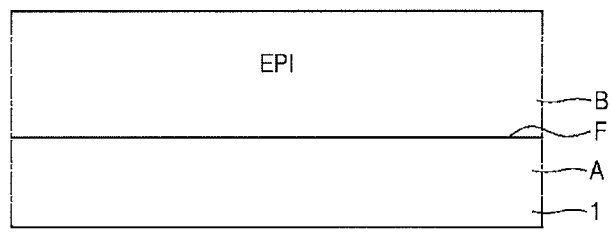

Referring to FIG. 4B, an epitaxial layer B is formed on the wafer A to form a substrate 1 comprising the wafer A and the epitaxial layer B. It is possible to perform a doping process in which additional impurities are implanted through the upper surface of the epitaxial layer B after the epitaxial layer B is grown.

Figure 4C:
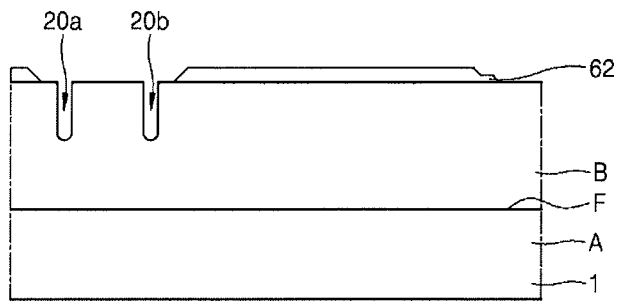

Referring to FIG. 4C, parts of the epitaxial layer B are removed, and a first trench 20a and a second trench 20b spaced apart from each other in a region including a boundary between the first region I and the fourth region IV, can be respectively formed.

Figure 4D:
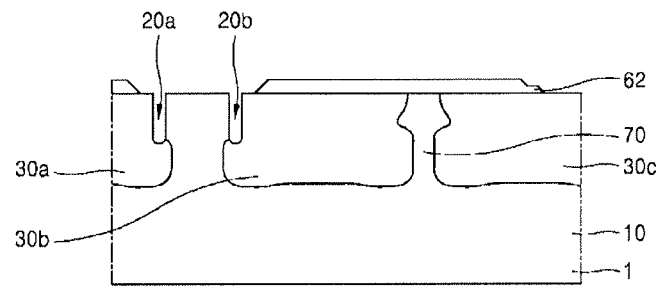

Referring to FIG. 4D, through a diffusion process such as heat treatment while impurities of a first conductivity type and a second conductivity type are implanted, floating regions 30a and 30b having a first conductivity type are formed in the region of the substrate 1 that corresponds to the first region I, an edge doped region 30c having a first conductivity type is formed in the region of the substrate 1 that corresponds to the second region II, and an edge junction isolation region 70 is formed in the region of the substrate 1 that corresponds to the third region III. Here, the lower portions of the floating regions 30a and 30b having a first conductivity type and the edge doped region 30c may include the boundary surface F between the wafer A and the epitaxial layer B.

Figure 4E:
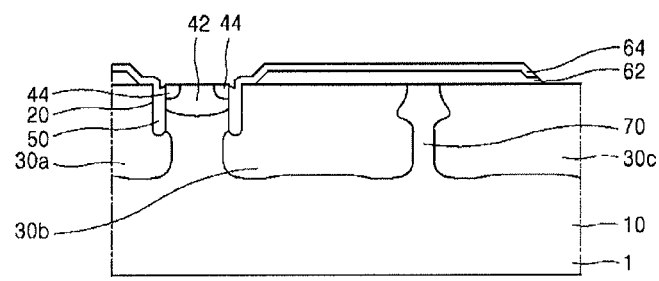

Referring to FIG. 4E, impurities are implanted into a region between the first trench 20a and the second trench 20b to form a body region 42 having a first conductivity type and a pair of source regions 44 and 44 that are spaced apart from each other and disposed adjacent to the first and second trenches 20a and 20b in the body region 42 having a first conductivity type. Subsequently, the inner walls of the first trench 20a and the second trench 20b may be lined with an insulating film and the first and second trenches 20a and 20b may be filled with a gate electrode material to form a gate electrode 50.

Figure 4F:
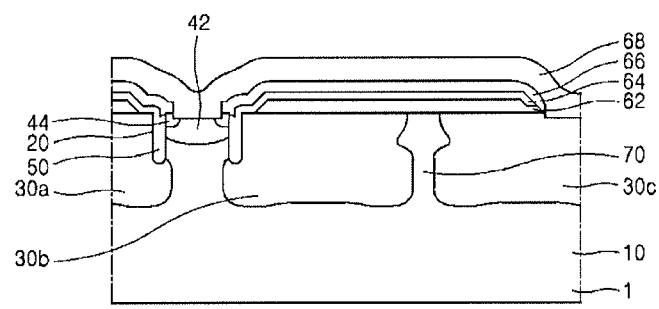

Referring to FIG. 4F, a wiring pattern 68 for electrically connecting the source region 44 and the edge doped region 30c is formed.

In the power semiconductor device implemented by the manufacturing method according to the embodiment of the present invention, which includes these steps, the location where the maximum electric field is generated in the edge junction isolation region 70 may be a region below the floating region 30b and the edge doped region 30c having a first conductivity type which includes the boundary surface F between the wafer A and the epitaxial layer B.

While the present invention has been described with reference to exemplary embodiments, it is to be understood that the invention is not limited to the disclosed exemplary embodiments, but, on the contrary, is intended to cover various modifications and equivalent arrangements included within the spirit and scope of the appended claims. Therefore, the true scope of the present invention should be determined by the technical idea of the appended claims.

The invention claimed is:

1. A power semiconductor device comprising:
   a gate electrode disposed in a trench of a substrate;
   a body region having a first conductivity type disposed on one side of the gate electrode in the substrate;
   a source region having a second conductivity type disposed adjacent to the gate electrode in the body region having a first conductivity type;

a floating region having a first conductivity type disposed on the other side of the gate electrode in the substrate;

an edge doped region having a first conductivity type spaced apart from the floating region having a first conductivity type and electrically connected to the source region in the substrate;

an edge junction isolation region having a second conductivity type interposed between the floating region having a first conductivity type and the edge doped region having a first conductivity type in the substrate; and a drift region having a second conductivity type disposed below the floating region having a first conductivity type, the edge doped region having a first conductivity type, and the edge junction isolation region having a second conductivity type, wherein the doping concentration of a second conductivity type in the edge junction isolation region is higher than the doping concentration of a second conductivity type in the drift region.

2. The device of claim 1,
wherein the edge doped region having a first conductivity type is disposed in an edge termination region of the device.

3. The device of claim 1, further comprising:
a wiring pattern disposed on the substrate to electrically connect the source region and the edge doped region having a first conductivity type.

4. The device of claim 1,
wherein the floating region having a first conductivity type surrounds the bottom surface and at least the other side of the gate electrode,
wherein the maximum doping depth of the floating region having a first conductivity type is larger than the depth of the trench, and
wherein the maximum doping depth of the edge doped region having a first conductivity type is larger than the depth of the trench.

5. The device of claim 4,
wherein, in a vertical distribution of the electric field from an upper surface of the substrate through a region between the floating region having a first conductivity type and the edge doped region having a first conductivity type to a lower surface of the substrate, a depth at which a maximum electric field is located is larger than the depth of the trench.

6. The device of claim 1,
wherein the substrate includes a wafer and an epitaxial layer grown on the wafer, and
wherein a region below the floating region having a first conductivity type and a region below the edge doped region having a first conductivity type include a boundary surface between the wafer and the epitaxial layer.

7. The device of claim 1,
wherein the second conductivity type and the first conductivity type have opposite conductivity types and are each one of n-type and p-type.

8. A method for fabricating a power semiconductor device, the method comprising:
implanting impurities having a first conductivity type into a first region and a second region on a wafer;
implanting impurities having a second conductivity type, which have a higher doping concentration than that of the impurities having a second conductivity type in the wafer, into a third region disposed between the first region and the second region;
forming a substrate by forming an epitaxial layer on the wafer, the substrate comprising the wafer and the epitaxial layer;
forming a floating region having a first conductivity type in the substrate corresponding to the first region, an edge doped region having a first conductivity type in the substrate corresponding to the second region, and an edge junction isolation region having a second conductivity type in the substrate corresponding to the third region, by diffusing the impurities;
forming a source region having a second conductivity type by implanting impurities into the epitaxial layer and diffusing the impurities; and
forming a wiring pattern for electrically connecting the source region and the edge doped region.

9. The method of claim 8,
wherein a region below the floating region having a first conductivity type and a region below the edge doped region having a first conductivity type include a boundary surface between the wafer and the epitaxial layer.

* * * * *